US010825784B2

(12) United States Patent
Sugimoto

(10) Patent No.: US 10,825,784 B2
(45) Date of Patent: Nov. 3, 2020

(54) DISCHARGING BRUSH, DISCHARGING DEVICE, AND DISCHARGING METHOD

(71) Applicant: Sakai Display Products Corporation, Osaka (JP)

(72) Inventor: Shinichi Sugimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 246 days.

(21) Appl. No.: 16/016,174

(22) Filed: Jun. 22, 2018

(65) Prior Publication Data

US 2018/0308809 A1    Oct. 25, 2018

Related U.S. Application Data

(63) Continuation-in-part of application No. PCT/JP2015/086074, filed on Dec. 24, 2015.

(51) Int. Cl.

| H01L 23/60 | (2006.01) |
| H05F 3/02 | (2006.01) |
| H01R 13/648 | (2006.01) |
| H01L 21/67 | (2006.01) |
| H01L 21/677 | (2006.01) |
| H01R 4/58 | (2006.01) |
| H01R 39/24 | (2006.01) |

(52) U.S. Cl.
CPC ............ *H01L 23/60* (2013.01); *H01L 21/677* (2013.01); *H01L 21/67011* (2013.01); *H01R 4/58* (2013.01); *H01R 13/6485* (2013.01); *H05F 3/02* (2013.01); *H01R 39/24* (2013.01)

(58) Field of Classification Search
CPC ....... H01L 21/6833; H01L 23/60; H05F 3/00; H05F 1/02; B65H 2301/5133

USPC ................... 361/207, 220–227, 212–219, 56
See application file for complete search history.

(56) References Cited

U.S. PATENT DOCUMENTS

| 5,377,069 A * | 12/1994 | Andreasson | H05F 3/00 361/212 |
| 2003/0151878 A1* | 8/2003 | Kano | H05K 7/1439 361/220 |
| 2014/0104741 A1* | 4/2014 | Oh | H05F 3/00 361/212 |

FOREIGN PATENT DOCUMENTS

| CN | 103153824 A | 6/2013 |
| CN | 204331231 U | 5/2015 |
| JP | H0210334 U | 1/1990 |
| JP | H08278706 A | 10/1996 |
| JP | 2012003897 A | 1/2012 |

(Continued)

OTHER PUBLICATIONS

English Translation of PCT International Search Report, PCT Application No. PCT/JP2015/086074, Japan Patent Office dated Mar. 8, 2016.

*Primary Examiner* — Bryan R Perez
(74) *Attorney, Agent, or Firm* — Snell & Wilmer L.L.P.

(57) ABSTRACT

The discharging brush 1 includes a conductive brush unit 11 and a grounding wire 15 connecting the brush unit 11 with a grounding point via a resistor 14. In a discharging device 100, the discharging brush 1 is installed at a conveyance path for conveying a display panel 2, in such a manner that the brush unit 11 is in sliding contact with a terminal 24 formed on a peripheral region of the display panel 2 conveyed along the conveyance path. For example, the resistor 14 has a resistance value equal to or greater than 1 MΩ and equal to or less than 10 MΩ.

6 Claims, 4 Drawing Sheets

(56) References Cited

FOREIGN PATENT DOCUMENTS

| | | | |
|---|---|---|---|
| JP | 5104301 | B2 | 12/2012 |
| WO | 2012054304 | A1 | 4/2012 |

\* cited by examiner

DISCHARGING BRUSH, DISCHARGING DEVICE, AND DISCHARGING METHOD

CROSS-REFERENCE TO RELATED APPLICATION

This is a continuation-in-part of PCT international application No. PCT/JP2015/086074 filed on Dec. 24, 2015, incorporated herein by reference.

BACKGROUND OF THE INVENTION

The present invention relates to a discharging brush, a discharging device, and a discharging method capable of realizing appropriate removal of static electricity and reduction in electrification amount.

BACKGROUND ART

Many of recent display devices are large in size and thin in thickness. Display panels of such display devices tend to be electrified in manufacturing processes. The electrification of a display panel may cause electro static discharge (ESD) when the display panel is brought into contact with a worker or an inspection device during manufacturing processes. The occurrence of ESD induces panel defectiveness. Accordingly, removal of static electricity of the display panel is necessary.

As a discharging method of the panel, there is a noncontact-type method using an ionizer (an anti-static blower or the like) capable of emitting charged particles and there is a contact-type method using a brush including a grounded conductor for electric discharge. For example, JP 5104301 B discloses that an ionizer serving as a noncontact-type discharging device and a conductive brush grounded as a contact-type discharging device are used together in manufacturing processes of an organic electro luminescence (EL) panel to remove static electricity of the organic EL panel.

Since removal of static electricity by the noncontact-type discharging method may be insufficient for recent large and thin display panels, the contact-type discharging method using a conductive bar or brush is often employed.

However, when the static electricity of an object to be discharged, such as a display panel, having an electronic circuit is removed by using the contact-type method, if the electrification amount of the object to be discharged is large, bringing the conductive bar or brush into contact with the object may cause large current to flow instantaneously and may damage the electronic circuit in the object.

SUMMARY OF THE INVENTION

The present invention has been made in view of the circumstance described above, and an object of the present invention is to provide a discharging brush, a discharging device, and a discharging method capable of realizing appropriate removal of static electricity and reduction in electrification amount.

A discharging brush according to an embodiment of the present invention includes a conductive brush unit and a grounding wire connecting the brush unit with a grounding point via a resistor.

A discharging device according to an embodiment of the present invention is provided in a display panel manufacturing system and the discharging device comprises the discharging brush.

A method for discharging a display panel according to an embodiment of the present invention comprises providing a discharging brush including a conductive brush unit and a grounding wire for connecting the brush unit with a grounding point via a resistor and bringing the brush unit into sliding contact with a terminal formed on a peripheral region of the display panel.

Accordingly, the present invention provides the discharging brush, the discharging device, and the discharging method capable of realizing appropriate removal of static electricity and reduction in electrification amount.

DETAILED DESCRIPTION

Hereinafter, embodiments of the present invention will be described in detail below with reference to attached drawings. Although respective embodiments include exemplary configurations, it is needless to say that the present invention is not limited to the following configurations.

First Embodiment

Figure 1:
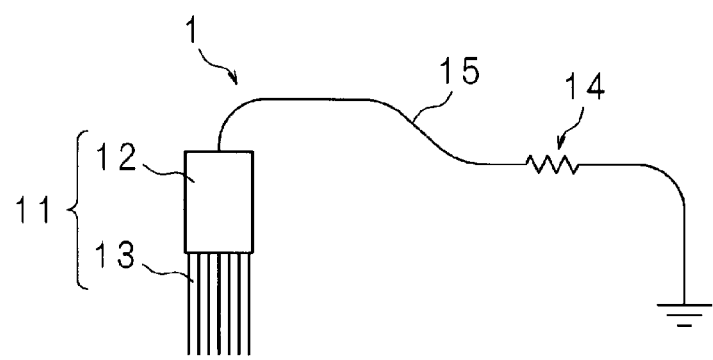
FIG. 1 schematically illustrates a discharging brush according to a first embodiment.

FIG. 1 schematically illustrates a discharging brush 1 according to a first embodiment. The discharging brush 1 includes a conductive brush unit 11 and a conductive wire 15. As described below, the conductive brush unit 11 is configured to contact with a terminal 24 formed on a peripheral region of the display panel to remove static electricity of the terminal 24. The conductive wire 15 is a grounding wire connecting the brush unit 11 with a grounding point via a resistor 14. The brush unit 11 includes a bristle implantation part 12 and a bristle bundle 13 implanted to a plurality of portions of the bristle implantation part 12. The bristle implantation part 12 may be, for example, made of metal and may be a flat plate having an elongated shape. The bristle bundle 13 is implanted to a lateral surface of the bristle implantation part 12 along the entire length of the bristle implantation part 12. The conductive wire 15 has a first end connected to the bristle implantation part 12 and a second end grounded. The resistor 14 has a resistance value of, for example, equal to or greater than 1 MΩ and equal to or less than 10 MΩ. The shape of the bristle implantation part 12 is not specifically limited.

The bristle implantation part 12 may be made of resin, in which a conductor electrically connected to the bristle bundle 13 is embedded. The conductor embedded in the bristle implantation part 12 may be connected to the conductive wire 15 equipped with the resistor 14. Further, the bristle implantation part 12 may have a grip part to be gripped by a worker to operate the brush unit 11.

Figure 2:
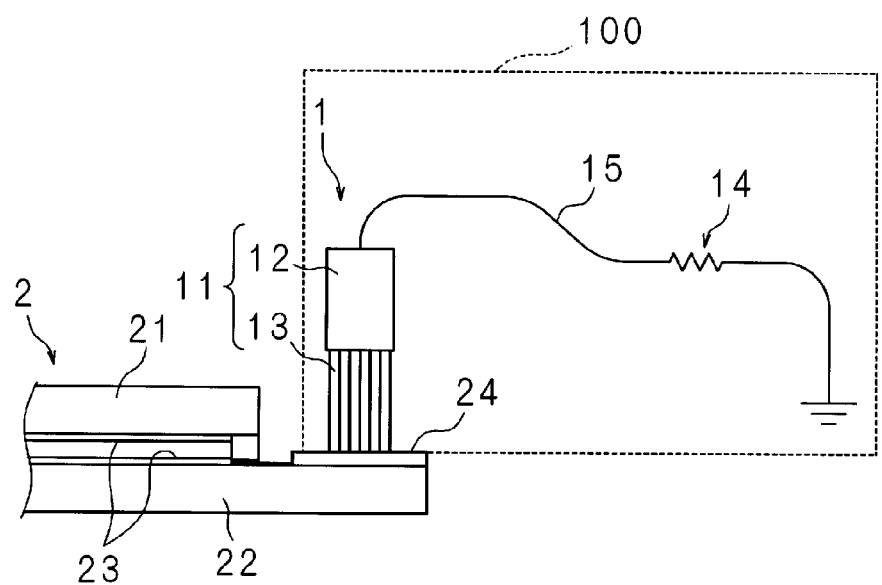
FIG. 2 illustrates an exemplary installation position of the discharging brush in a discharging device according to the first embodiment.

FIG. 2 illustrates an exemplary installation position of the discharging brush 1 incorporated in a discharging device 100 according to the present embodiment. The discharging device 100 having the discharging brush 1 is provided in a manufacturing system of a display panel 2. More specifically, the discharging device 100 is installed at a conveyance path along which the display panel 2 of a display device is conveyed. The discharging brush 1 of the discharging device 100 has a configuration similar to that of the discharging brush illustrated in FIG. 1. The display panel 2 includes a color filter (CF) substrate 21 and a thin film transistor (TFT) substrate 22. The CF substrate 21 has counter electrodes formed on a rear surface of the CF substrate 21. The TFT substrate 22 has a circuit, including pixel electrodes, gate and source bus lines connected to TFTs of respective pixel electrodes, and common electrodes 23. The counter electrodes are connected to the common electrodes 23. As illustrated in FIG. 2, the TFT substrate 22 is slightly larger than the CF substrate 21. In a peripheral region of the TFT substrate 22, a terminal 24 is formed in such a manner that the terminal 24 is exposed when the CF substrate 21 is mounted on the TFT substrate 22. In the embodiment, a plurality of terminals 24 are provided to the peripheral region of the TFT substrate 22 and the gate and source bus lines and the common electrodes 23 are respectively connected to the terminals 24. Although not illustrated, gate and source drivers are connected to the terminals 24 via flexible substrates.

The discharging brush 1 is installed at a position where tips of the bristle bundle 13 are in sliding contact with the terminals 24 of a display panel conveyed along the conveyance path. For example, in a display device manufacturing system, the discharging device 100 may be provided in a same region as a region where an anti-static blower for emitting charged particles toward a display panel is provided along the conveyance path. In this case, in a discharging step (a step of bringing the brush unit into sliding contact with a terminal), the display panel is discharged by the anti-static blower and the discharging brush 1 in the same region. In alternative, the discharging device 100 may be provided in downstream of the region where the anti-static blower is provided. In this case, the display panel is discharged in a first discharging step by the anti-static blower, and then, discharged in a second discharging step (a step of bringing the brush unit into sliding contact with a terminal) by the discharging brush 1.

Figure 3:
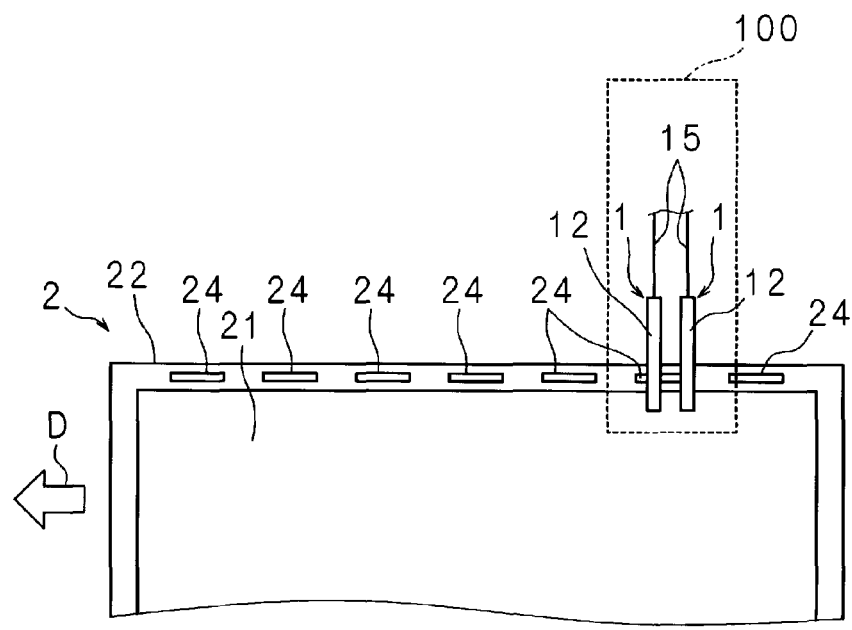
FIG. 3 illustrates another installation position of the discharging brush according to the first embodiment.

FIG. 3 illustrates another installation position of the discharging brush 1 according to the first embodiment. FIG. 3 illustrates the display panel 2 conveyed along the conveyance path in a conveyance direction D indicated by an arrow in FIG. 3. According to the illustrated example, the discharging device 100 is equipped with a plurality of (two in FIG. 3) discharging brushes 1. As illustrated in FIG. 3, the plurality of discharging brushes 1 are disposed side-by-side in the conveyance direction D in such a manner that each bristle bundle 13 (positioned behind the bristle implantation part 12 in FIG. 3) is in sliding contact with a peripheral region (extending along one long side of the display panel 2 in FIG. 3) of the display panel 2 while the display panel 2 is conveyed along the conveyance path to remove the static electricity of the terminal 24 formed on the peripheral region. Arranging the plurality of discharging brushes 1 each being grounded via the resistor 14 in this manner can realize effective static elimination. Alternatively, the plurality of discharging brushes 1 may be grounded via one common resistor 14.

Installing the discharging brush 1 as illustrated in FIG. 2 and FIG. 3 enables electric charges accumulated on the display panel 2 on the conveyance path, specifically internal electric charges accumulated on the pixel electrodes, counter electrodes, respective bus lines, common electrodes 23, and TFTs of the display panel 2, to flow through the bristle bundle 13 and the bristle implantation part 12 and reach the grounding point via the resistor 14, thereby removing static electricity of the display panel 2. In this case, the internal electric charges can be effectively removed since the discharging brush 1 is brought into direct contact with the object to be discharged.

The discharging brush 1 according to the first embodiment is grounded via the resistor 14, as mentioned above. Such an arrangement can suppress the occurrence of rapid electric discharge when the discharging brush 1 comes into contact with the display panel 2. Therefore, damage of an electronic circuit having refined electrodes and various elements connected to the electrodes can be prevented. Effects brought by grounding the discharging brush 1 via the resistor 14 will be described in detail below with reference to FIGS. 4 and 5.

Figure 4:
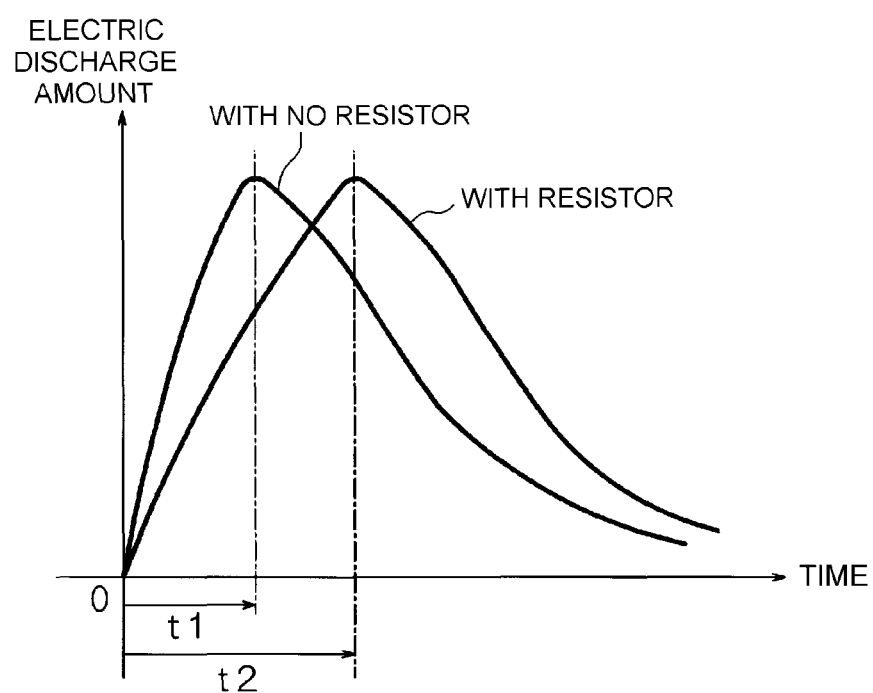
FIG. 4 illustrates slower electric discharge as an exemplary effect brought by the discharging brush according to the first embodiment.

FIG. 4 illustrates slower electric discharge as an exemplary effect brought by the discharging brush 1 according to the first embodiment. In FIG. 4, the horizontal axis represents time. The origin (zero point) on the time axis corresponds to the time when tips of the bristle bundle 13 of the discharging brush 1 come into contact with an object to be discharged (the display panel 2 in the first embodiment). In FIG. 4, the vertical axis represents the magnitude of discharge current (electric discharge amount). FIG. 4 is a graph illustrating differences in waveform of the discharge current, which depend on the presence of the resistor 14. As illustrated in FIG. 4, grounding a discharging brush without using the resistor 14 (hereinafter, referred to as "conventional discharging brush"), namely in the case of "with no resistor", requires time t1 for the discharge current to reach the peak. On the other hand, grounding the discharging brush 1 via the resistor 14, namely in the case of "with resistor", requires time t2 (approximately two times the time t1) for the discharge current to reach the peak. Grounding the discharging brush 1 via the resistor 14 in this manner can slow the discharge of electrified charges on the display panel 2 and can prevent large current from flowing instantaneously, thereby preventing the electronic circuit from being damaged.

Figure 5:
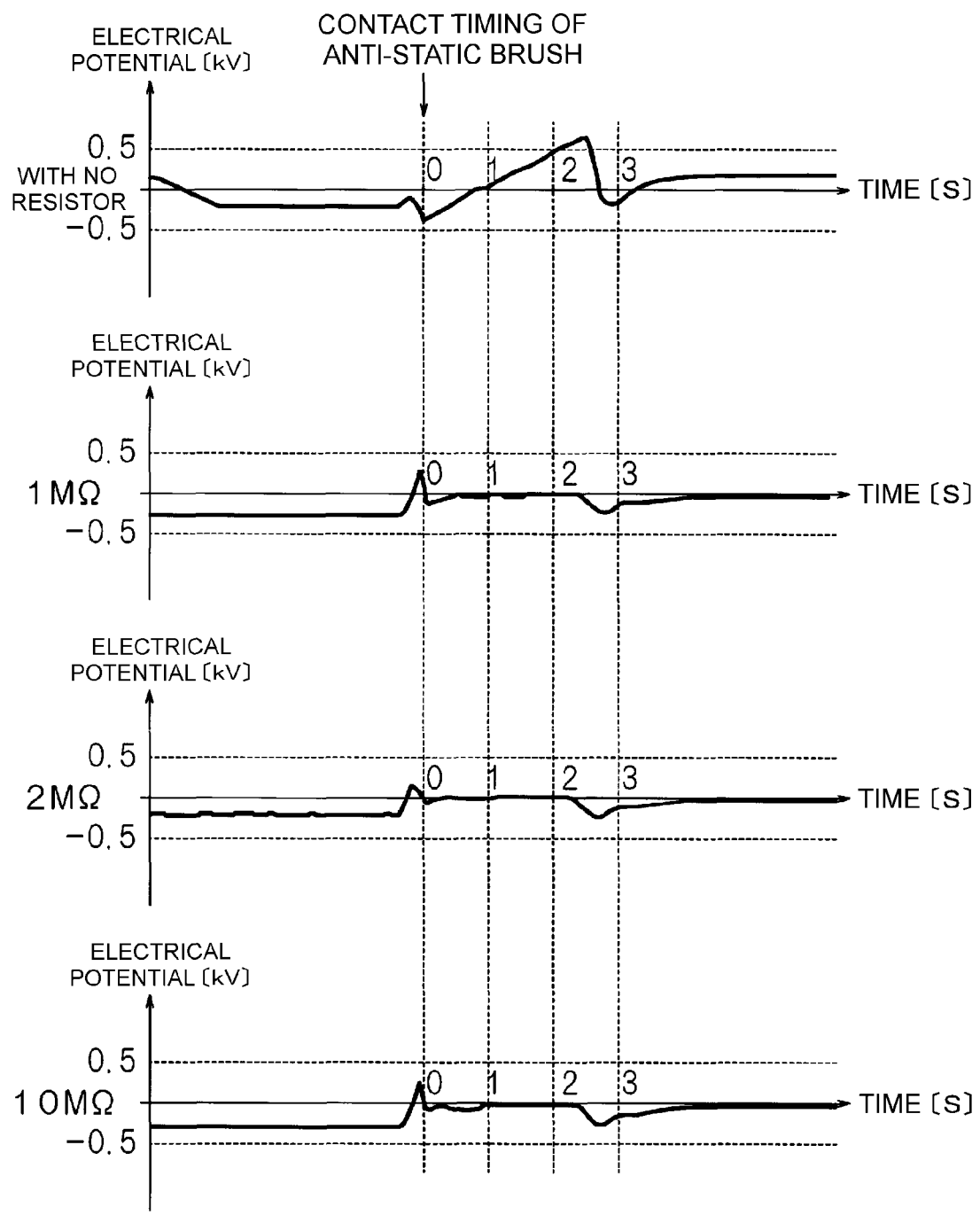
FIG. 5 is a graph illustrating experimental results demonstrating effects variable depending on the resistance value of a resistor.

FIG. 5 is a graph illustrating experimental results demonstrating the effects variable depending on the resistance value of the resistor 14. FIG. 5 illustrates differences in electrification amount of the display panel 2 variable depending on the resistance value. In each graph of FIG. 5, the horizontal axis represents elapsed time and the vertical axis represents the electrification amount (electrical potential) of the display panel 2. The display panel 2 was a 60-inch type. The uppermost graph in FIG. 5 indicates an exemplary transition of the electrification amount when the conventional discharging brush (having no resistor) was used. The second graph from the top in FIG. 5 indicates an exemplary transition of the electrification amount when the resistor 14 of the discharging brush 1 was a resistor having a resistance value of 1 MΩ. The third graph from the top in FIG. 5 indicates an exemplary transition of the electrification amount when the resistor 14 of the discharging brush 1 was a resistor having a resistance value of 2 MΩ. The lowermost graph in FIG. 5 indicates an exemplary transition of the electrification amount when the resistor 14 of the discharging brush 1 was a resistor having a resistance value of 10 MΩ. An arrow in FIG. 5 indicates the timing when the discharging brush 1 came into contact with the terminal 24 of the display panel 2, in each graph.

As understood from FIG. 5, when the resistance value is equal to or greater than 1 MΩ and equal to or less than 10 MΩ, the change in the electrical potential is especially slow after the contact of the discharging brush 1 and the electrical potential is closer to zero. In short, it is understood that grounding the discharging brush 1 via the resistor 14 having a resistance value equal to or greater than 1 MΩ and equal to or less than 10 MΩ can effectively suppress the occurrence of rapid electric discharge.

It is needless to say that the discharging brush 1 is not limited to the above-mentioned configuration in which the discharging brush 1 is installed at the conveyance path. For example, a worker or a robot may manipulate the discharging brush 1. More specifically, the worker or the robot may move the discharging brush 1 and bring the bristle bundle 13 of the discharging brush 1 into contact with a predetermined position of an object to be discharged (the terminal 24 on the peripheral region of the display panel 2) to remove the static electricity of the object to be discharged.

As another example, when a polarizing plate is attached to the display panel 2, the bristle bundle 13 of the discharging brush 1 may be kept in contact with the terminal 24 in the peripheral region, the polarizing plate, and the panel surface. On the other hand, when the polarizing plate is detached from the panel surface, it may be useful to perform the work while keeping the bristle bundle 13 of the discharging brush 1 in contact with the surface of the polarizing plate or the panel surface of the display panel 2. In this case, when a film (polarizing plate) is attached to or detached from the CF substrate 21 and the TFT substrate 22, each being a glass substrate, it is feasible to reduce electrification that may be caused by static electricity occurring on the surface of the display panel 2.

Further, in addition to static elimination, it is also effective to use the discharging brush 1 including the resistor 14 for removal of foreign substance from a system on film (SOF) used in the display panel 2. Further, the discharging brush 1 may also be used for discharging the display panel 2 being cut out from mother glass.

If the conveyance path of the display panel 2 has a roller made of rubber, the problem of electrification may arise in a display panel by coming into contact with an external surface of the roller. In this case, it is useful to keep tips of the bristle bundle 13 of the discharging brush 1 in contact with the roller constituting the conveyance path, rather than the display panel. Such an arrangement can suppress the occurrence of electrification when the display panel is conveyed while being kept in contact with the roller made of rubber.

Further, as mentioned above, in the discharging step, combining the discharging brush 1 with a discharging element (e.g., an anti-static bar, an anti-static blower, or the like) other than the discharging brush 1 may be useful to remove static electricity of the display panel 2. Particularly, the combined use of the discharging brush 1 and the discharging element other than the discharging brush 1 is effective for removing static electricity from a highly electrified panel. When only the discharging brush 1 capable of effectively removing internal charges is used, there are cases where discharging surface charges is insufficient. Even in the case, by using another discharging element in addition to the discharging brush 1, the discharging ability is enhanced and the surface charges can be appropriately removed.

Second Embodiment

Figure 6:
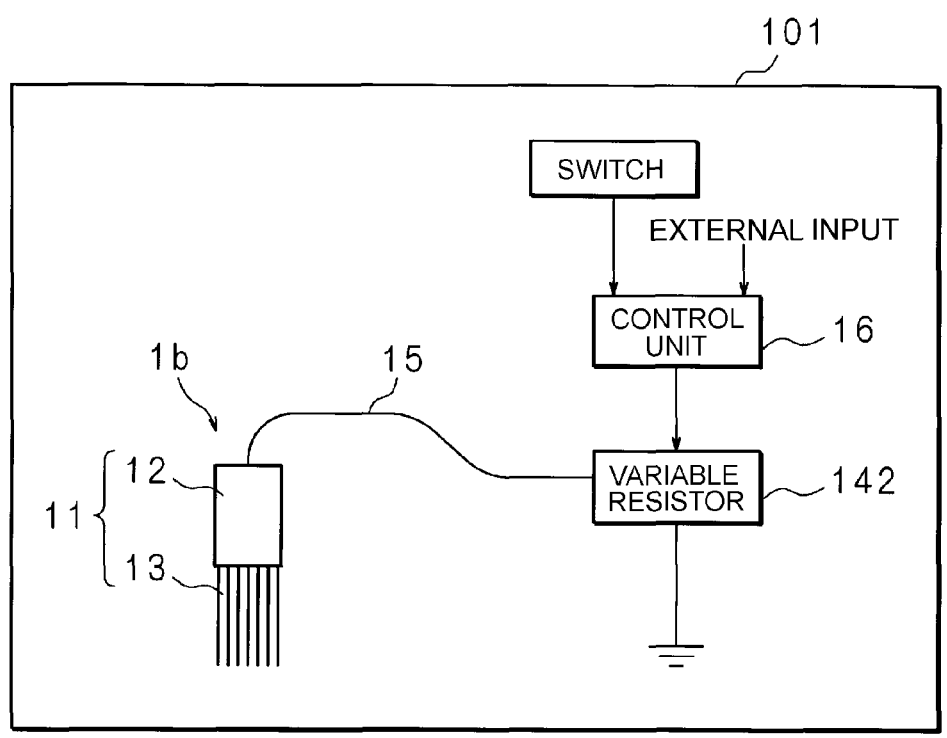
FIG. 6 is a block diagram illustrating an exemplary configuration of a discharging device according to a second embodiment.

FIG. 6 is a block diagram illustrating an exemplary configuration of a discharging device 101 according to a second embodiment. The discharging device 101 according to the second embodiment includes a discharging brush 1b grounded via a variable resistor 142 and a control unit 16 controlling the resistance value of the variable resistor 142. Replacing the resistor 14 of the discharging brush 1 described in the first embodiment by the variable resistor 142 can obtain the discharging brush 1b according to the second embodiment. The configuration of the discharging brush 1b is similar to that of the discharging brush 1 according to the first embodiment, except for the variable resistor 142 and the control unit 16. Therefore, common constituent components are denoted by the same reference numerals and detailed description thereof will be omitted.

In the discharging device 101 according to the second embodiment, the control unit 16 changes the resistance value of the variable resistor 142 according to switching of a switch or in response to an external input signal. The resistance value of the variable resistor 142 is selectable among a plurality of ranges (for example, three ranges: equal to or greater than 1 MΩ and equal to or less than 2 MΩ; equal to or greater than 2 MΩ and equal to or less than 5 MΩ; and equal to or greater than 5 MΩ and equal to or less than 10 MΩ), and the control unit 16 may be configured to select one of these ranges. The control unit 16 may be configured to change the resistance value of the variable resistor 142 depending on the size of the display panel 2. Specifically, the control unit 16 may be configured to change the resistance value so as to increase the resistance value as the size of the display panel 2 becomes larger.

As a technical knowledge derived from experiments, setting the resistance values of the resistors 14 and 142 to be equal to or greater than 1 MΩ and equal to or less than 2 MΩ is effective when the display panel 2 is a 40-inch type. Further, as another technical knowledge derived from experiments, setting the resistance values of the resistors 14 and 142 to be equal to or greater than 2 MΩ and equal to or less than 5 MΩ is effective when the size of the display panel 2 is equal to or more than 40-inch and equal to or less than 80-inch. In addition, as another technical knowledge derived from experiments, setting the resistance values of the resistors 14 and 142 to be equal to or greater than 5 MΩ and equal to or less than 10 MΩ is effective when the size of the display panel 2 is equal to or more than 80-inch.

Accordingly, it is useful to employ a configuration in that the resistance value of the variable resistor 142 is selectable among three ranges (first range: equal to or greater than 1 MΩ and equal to or less than 2 MΩ, second range: equal to or greater than 2 MΩ and equal to or less than 5 MΩ, and third range: equal to or greater than 5 MΩ and equal to or less than 10 MΩ) and each range is associated with the size of the display panel 2. The control unit 16 may be configured to receive signal associated with the size range of the display panel 2 (e.g., equal to or less than 40 inches, equal to or more than 40 inches and equal to or less than 80 inches, and equal to or more than 80 inches) from the switch or external input. In this case, when the control unit 16 receives the signal associated with the size range of the display panel 2 (for example, a worker operate the switch according to the size of the display panel 2), a desired range for the resistance value of the variable resistor 142 can be selected.

According to the above-mentioned embodiments, bringing the discharging brush 1 or 1b into direct contact with an object to be discharged ensures electric discharge and can realize sufficient static elimination. Further, since the discharging brush 1 is grounded via the resistor 14 and the discharging brush 1b is grounded via the variable resistor 142, the occurrence of rapid electric discharge can be suppressed and an electronic circuit can be prevented from being damaged. In other words, appropriate removal of static electricity and reduction in electrification amount can be realized.

When the object to be discharged is the display panel 2, internal charges accumulated on terminals connected to the source and gate bus lines or terminals connected to the common electrodes can be slowly and effectively removed. Therefore, an electronic circuit including electrodes and respective element groups connected to these electrodes can be prevented from being damaged by rapid electric discharge.

The disclosed embodiments are to be considered as being illustrative and not restrictive, in all respects. The scope of the present invention is defined not by the above descriptions but by the following claims, with an intention to encompass the meaning equivalent to the claims and various changes within the scope thereof.

What is claimed is:

1. A discharging device provided in a display panel manufacturing system having a conveyance path for conveying a display panel, the discharging device comprising a discharging brush,
   wherein the discharging brush comprises
   a conductive brush unit configured to contact with a terminal formed on a peripheral region of the display panel to remove static electricity of the terminal; and
   a grounding wire connecting the brush unit with a grounding point via a resistor,
   wherein the resistor has a resistance value equal to or greater than 1 MΩ and equal to or less than 10 MΩ,
   wherein the discharging brush is installed at the conveyance path in such a manner that the brush unit is in sliding contact with the terminal formed on the peripheral region of the display panel while the display panel is conveyed along the conveyance path, and
   wherein the resistor is a variable resistor and the discharging device further comprises a control unit controlling the resistance value of the variable resistor.

2. The discharging device according to claim 1,
   wherein the resistance value of the variable resistor is selectable among a plurality of ranges, and
   wherein the control unit selects any one of the plurality of ranges in accordance with the type of the display panel.

3. A method for discharging a display panel having a terminal formed on a peripheral region of the display panel comprising:
   providing a discharging brush including a conductive brush unit and a grounding wire for connecting the brush unit with a grounding point via a resistor, the resistor being a variable resistor, the conductive brush unit configured to contact with the terminal formed on the peripheral region of the display panel to remove the static electricity of the terminal;
   controlling the resistance value of the variable resistor; and
   bringing the brush unit into sliding contact with the terminal formed on the peripheral region of the display panel,
   wherein the resistor has a resistance value equal to or greater than 1 MΩ and equal to or less than 10 MΩ.

4. The method for discharging the display panel according to claim 3, wherein the resistance value of the variable resistor is selectable among a plurality of ranges and the method for discharging the display panel further comprises selecting any one of the plurality of ranges in accordance with the type of the display panel.

5. A discharging device comprising a discharging brush for discharging a display panel having a terminal formed on a peripheral region of the display panel, and a control unit, wherein the discharging brush comprises a conductive brush unit configured to contact with the terminal formed on the peripheral region of the display panel to remove static electricity of the terminal; and a grounding wire connecting the brush unit with a grounding point via a resistor, the resistor being a variable resistor, wherein the control unit controls the resistance value of the variable resistor, and wherein the resistor has a resistance value equal to or greater than 1 MΩ and equal to or less than 10 MΩ,
   wherein the resistance value of the variable resistor is selectable among a plurality of ranges; and wherein the control unit selects any one of the plurality of ranges in accordance with the type of the display panel.

6. A discharging device comprising a discharging brush for discharging a display panel having a terminal formed on a peripheral region of the display panel, and a control unit, wherein the discharging brush comprises a conductive brush unit configured to contact with the terminal formed on the peripheral region of the display panel to remove static electricity of the terminal; and a grounding wire connecting the brush unit with a grounding point via a resistor, the resistor being a variable resistor, wherein the control unit controls the resistance value of the variable resistor, and wherein the resistor has a resistance value equal to or greater than 1 MΩ and equal to or less than 10 MΩ,
   wherein the resistance value of the variable resistor is selectable among a plurality of ranges; wherein the discharging device further comprises a switch for selecting the plurality of ranges; and wherein the control unit selects any one of the plurality of ranges in accordance with the state of the switch.

* * * * *